(12) United States Patent
Park et al.

(10) Patent No.: US 7,994,053 B2
(45) Date of Patent: Aug. 9, 2011

(54) PATTERNING METHOD OF METAL OXIDE THIN FILM USING NANOIMPRINTING, AND MANUFACTURING METHOD OF LIGHT EMITTING DIODE

(75) Inventors: Hyeong-Ho Park, Daejeon (KR); Dae-Geun Choi, Daejeon (KR); Jun-Ho Jeong, Daejeon (KR); Ki-Don Kim, Seoul (KR); Jun-Hyuk Choi, Daejeon (KR); Ji-Hye Lee, Daejeon (KR); Seong-Je Park, Daejeon (KR); So-Hee Jeon, Seoul (KR); Sa-Rah Kim, Daejeon (KR)

(73) Assignee: Korea Institute of Machinery & Materials, Jang-Dong, Yuseong-Ku, Daejon (KR)

( * ) Notice: Subject to any disclaimer, the term of this patent is extended or adjusted under 35 U.S.C. 154(b) by 0 days.

(21) Appl. No.: 12/655,435

(22) Filed: Dec. 30, 2009

(65) Prior Publication Data
US 2011/0049548 A1    Mar. 3, 2011

(30) Foreign Application Priority Data
Sep. 2, 2009  (KR) .................. 10-2009-0082592

(51) Int. Cl.
*H01L 21/44*   (2006.01)

(52) U.S. Cl. ................. 438/669; 438/683; 257/E21.017
(58) Field of Classification Search .................. 438/22, 438/29, 669, 683; 257/E21.017, E21.02
See application file for complete search history.

(56) References Cited

U.S. PATENT DOCUMENTS
7,384,809 B2    6/2008   Donofrio
2008/0217813 A1*  9/2008  Chou .......................... 264/293

FOREIGN PATENT DOCUMENTS
JP    2007-080455    3/2007
KR    10-2007-0102263   10/2007
KR    10-2009-0019200    2/2009

* cited by examiner

*Primary Examiner* — Hoai v Pham
(74) *Attorney, Agent, or Firm* — Lexyoume IP Group, PLLC.

(57) ABSTRACT

A method for forming a metal oxide thin film pattern using nanoimprinting according to one embodiment of the present invention includes: coating a photosensitive metal-organic material precursor solution on a substrate; pressurizing the photosensitive metal-organic material precursor coating layer to a mold patterned to have a protrusion and depression structure; forming the metal oxide thin film pattern by irradiating ultraviolet rays to the pressurized photosensitive metal-organic material precursor coating layer to cure it; and removing the patterned mold from the metal oxide thin film pattern.

19 Claims, 10 Drawing Sheets

(a) Initiation (b) Propagation (a)

(b)

(c)

PATTERNING METHOD OF METAL OXIDE THIN FILM USING NANOIMPRINTING, AND MANUFACTURING METHOD OF LIGHT EMITTING DIODE

CROSS-REFERENCE TO RELATED APPLICATION

This application claims priority to and the benefit of Korean Patent Application No. 10-2009-0082592 filed in the Korean Intellectual Property Office on Sep. 2, 2009, the entire contents of which are incorporated herein by reference.

BACKGROUND OF THE INVENTION (a) Field of the Invention

The present invention relates to a nanoimprint process, and more particularly, to a method for forming a metal oxide thin film pattern on a substrate using ultraviolet nanoimprinting, and a manufacturing method of a light emitting diode (LED) device using the same.

(b) Description of the Related Art

Nanoimprinting is a technology that proposes to realize nanoprocessing (1 to 100 nm) that is microprocessing, and involves transferring a pattern by applying pressure to a mold having a nanosize and that is applied with a photocurable resin or thermoplastic resin and irradiating ultraviolet rays to the mold or heating it to cure.

Using the nanoimprint technology can simplify manufacture of a nanostructure like stamping a seal while overcoming a miniaturization critical point in a photolithography scheme used in the current semiconductor process.

In addition, using the nanoimprint technology improves the current 100 nm class fine process to a 10 nm fine process, thereby promoting a technology of a next-generation semiconductor field. In particular, the nanoimprint technology is considered a technology for forming a circuit for a next-generation semiconductor and flat panel display.

The nanoimprint technology is classified into a thermal imprinting technology that uses an opaque silicon stamp and an UV imprinting technology that uses a scheme of curing a resin by transmitting ultraviolet rays through a transparent quartz stamp (or transparent quartz substrate upon using a silicon stamp), according to a curing scheme.

Among those, in the UV nanoimprint process, a master pattern is first manufactured on a transparent mold substrate through nanolithography equipment such as electron beam, etc. A prepolymer resin that is cured by ultraviolet rays is spin-coated (or dispensed) on the substrate, and then the manufactured master contacts the resin. At this time, the resin is filled in the pattern by a capillary force, thereby performing the pattern transfer. After the filling is completed, ultraviolet rays passing through the transparent substrate cure the polymer and the master mold is then removed. In order to implement smooth filling and a uniform pattern size upon imprinting, the master mold should not directly contact the substrate. At this time, the generated residual thickness is removed by physical etching, thereby making it possible to etch the substrate or lift the metal off through post-processing if necessary.

When forming and patterning the metal oxide thin film on the substrate, the pattern is formed on the ultraviolet resin (resist) with the nanoimprint and the patterned metal oxide thin film is then formed by the etching process, such that the process is complicated.

The above information disclosed in this Background section is only for enhancement of understanding of the background of the invention and therefore it may contain information that does not form the prior art that is already known in this country to a person of ordinary skill in the art.

SUMMARY OF THE INVENTION

Based on the technical background as described above, the present invention has been made in an effort to provide a method for forming a metal oxide thin film pattern by applying a photosensitive metal-organic material precursor solution on a substrate without a photosensitive prepolymer resin (resist), and directly patterning it in a nanoimprint scheme.

In addition, the present invention has been made in an effort to provide a metal oxide thin film pattern that is directly patterned according to a method for forming a metal thin film pattern using an imprint.

Further, the present invention has been made in an effort to provide a manufacturing method of an LED device that forms a photonic crystal layer according to a method for forming a metal oxide thin film using an imprint.

An exemplary embodiment of the present invention provides a method for forming a metal oxide thin film pattern using nanoimprinting, including: coating a photosensitive metal-organic material precursor solution on a substrate; pressurizing the photosensitive metal-organic material precursor coating layer to a mold patterned to have a protrusion and depression structure pattern; forming the metal oxide thin film pattern by irradiating ultraviolet rays to the pressurized photosensitive metal-organic material precursor coating layer to cure it; and removing the patterned mold from the metal oxide thin film pattern.

The method for forming a metal oxide thin film pattern may further include annealing the metal oxide thin film pattern.

The photosensitive metal-organic material precursor solution includes the metal-organic material precursor composed by bonding an organic material ligand to the metal.

A metal element forming the metal-organic material precursor may include any one or more metals selected from a group consisting of lithium (Li), beryllium (Be), boron (B), sodium (Na), magnesium (Mg), aluminum (Al), silicon (Si), phosphorous (P), sulfur (S), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), arsenic (As), selenium (Se), rubidium (Rb), strontium (Sr), zirconium (Zr), niobium (Nb), molybdenum (Mo), ruthenium (Ru), rhodium (Rh), indium (In), tin (Sn), antimony (Sb), barium (Ba), lanthanum (La), cerium (Ce), praseodymium (Pr), neodymium (Nd), promethium (Pm), gadolinium (Gd), hafnium (Hf), tantalum (Ta), tungsten (W), iridium (Ir), lead (Pb), bismuth (Bi), polonium (Po), and uranium (U).

The organic material ligand may be selected from a group consisting of ethylhexanoate, acetylacetonate, dialkyldithiocarbamate, carboxylic acid, carboxylate, pyridine, diamine, arsine, diarsine, phosphine, diphosphine, butoxide, isopropoxide, ethoxide, chloride, acetate, carbonyl, carbonate, hydroxide, arena, beta-diketonate, and 2-nitrobenzaldehyde, and mixtures thereof.

The metal-organic material precursor may be dissolved in a solvent selected from a group consisting of hexanes, 4-methyl-2-pentanone, ketone, methyl isobutyl ketone, methyl ethyl ketone, water, methanol, ethanol, propanol, isopropanol, butanol, pentanol, hexanol, dimethyl sulfoxide (DMSO), dimethylformamide (DMF), N-methylpyrrolidone, acetone, acetonitrile, tetrahydrofuran (THF), tecan, nonane, octane, heptanes, and pentane.

Another embodiment of the present invention provides a method for forming a metal oxide thin film pattern using nanoimprinting, including: attaching a mask having a second pattern on a mold having a protrusion and depression structure of a first pattern; coating a photosensitive metal-organic material precursor solution on a substrate; pressurizing the photosensitive metal-organic material precursor coating layer to the mold to which the mask is attached; forming the metal oxide thin film pattern by irradiating ultraviolet rays to the pressurized photosensitive metal-organic material precursor coating layer to cure it; removing the patterned mold from the metal oxide thin film pattern; and developing the metal oxide thin film pattern.

The first pattern may be formed to have a protrusion and depression structure of a nanoscale, and the second pattern may be formed to have a plane structure of a microscale.

The method for forming a metal oxide thin film pattern may further include annealing the metal oxide thin film pattern.

Yet another embodiment of the present invention provides a method for manufacturing an LED device having a photonic crystal structure using nanoimprinting, including: coating a photosensitive metal-organic material precursor solution on a layer, on which the photonic crystal structure is formed, on a substrate; pressurizing the photosensitive metal-organic material precursor coating layer to a mold patterned to have a protrusion and depression structure corresponding to the photonic crystal structure; forming a metal oxide thin film pattern cured by irradiating ultraviolet rays to the pressurized photosensitive metal-organic material precursor coating layer; and removing the mold from the metal oxide thin film pattern having the photonic crystal structure.

The method for forming a metal oxide thin film pattern may further include annealing the metal oxide thin film pattern.

As described above, with the method for forming the metal oxide thin film pattern using the nanoimprinting, the metal oxide thin film pattern is used as the resist, such that the process of separately applying the ultraviolet resin can be omitted, thereby making it possible to simplify the process for forming the pattern.

Therefore, the present invention can be applied to various fields, such as a semiconductor, a display, a solar cell, a light emitting diode (LED), an organic light emitting diode (OLED), etc., that needs the metal oxide thin film pattern, in a simplified process.

DETAILED DESCRIPTION OF THE EMBODIMENTS

Figure 1:
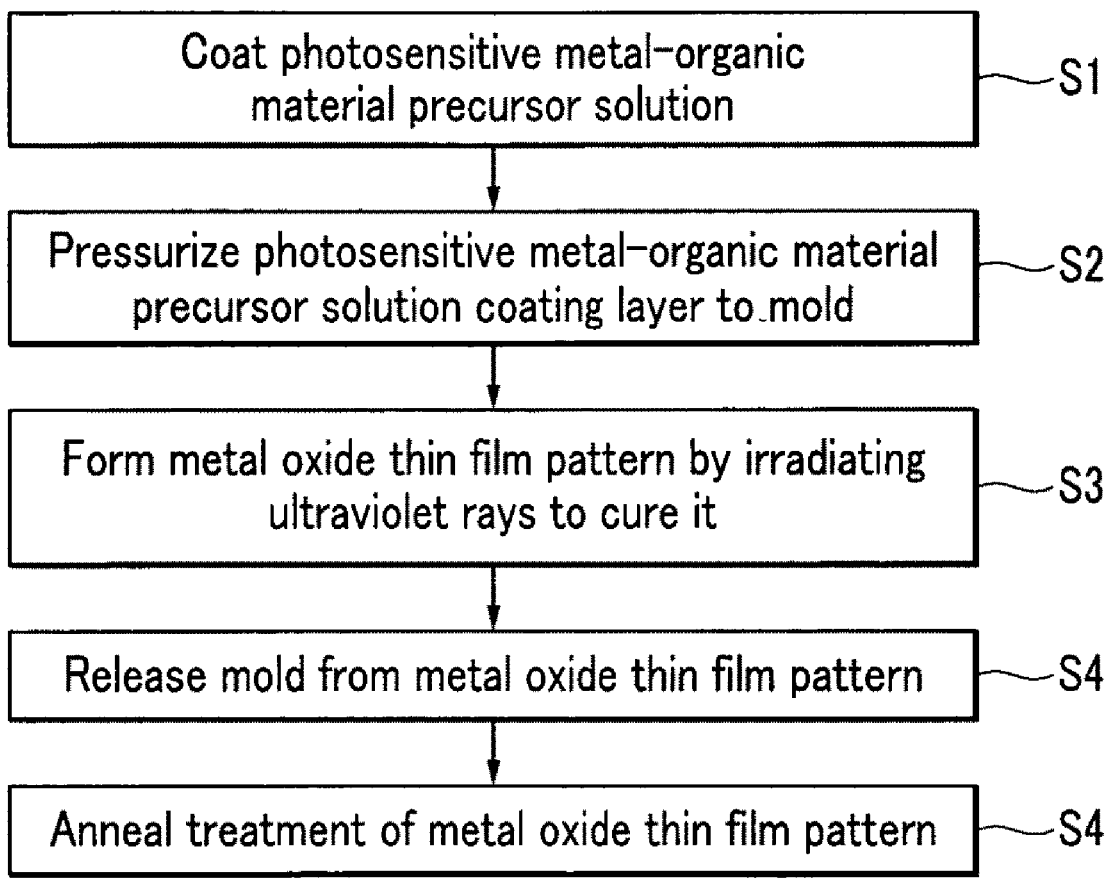
FIG. 1 is a flowchart showing a method for forming a metal oxide thin film pattern using nanoimprinting according to an embodiment of the present invention.

Hereinafter, exemplary embodiments of the present invention will be described in detail to be easily made by a person skilled in the art with reference to the accompanying drawings. The present invention can be implemented in various forms, and therefore is not limited to the embodiments implemented herein. The drawings and description are to be regarded as illustrative in nature and not restrictive. Like reference numerals designate like elements throughout the specification.

Figure 2:
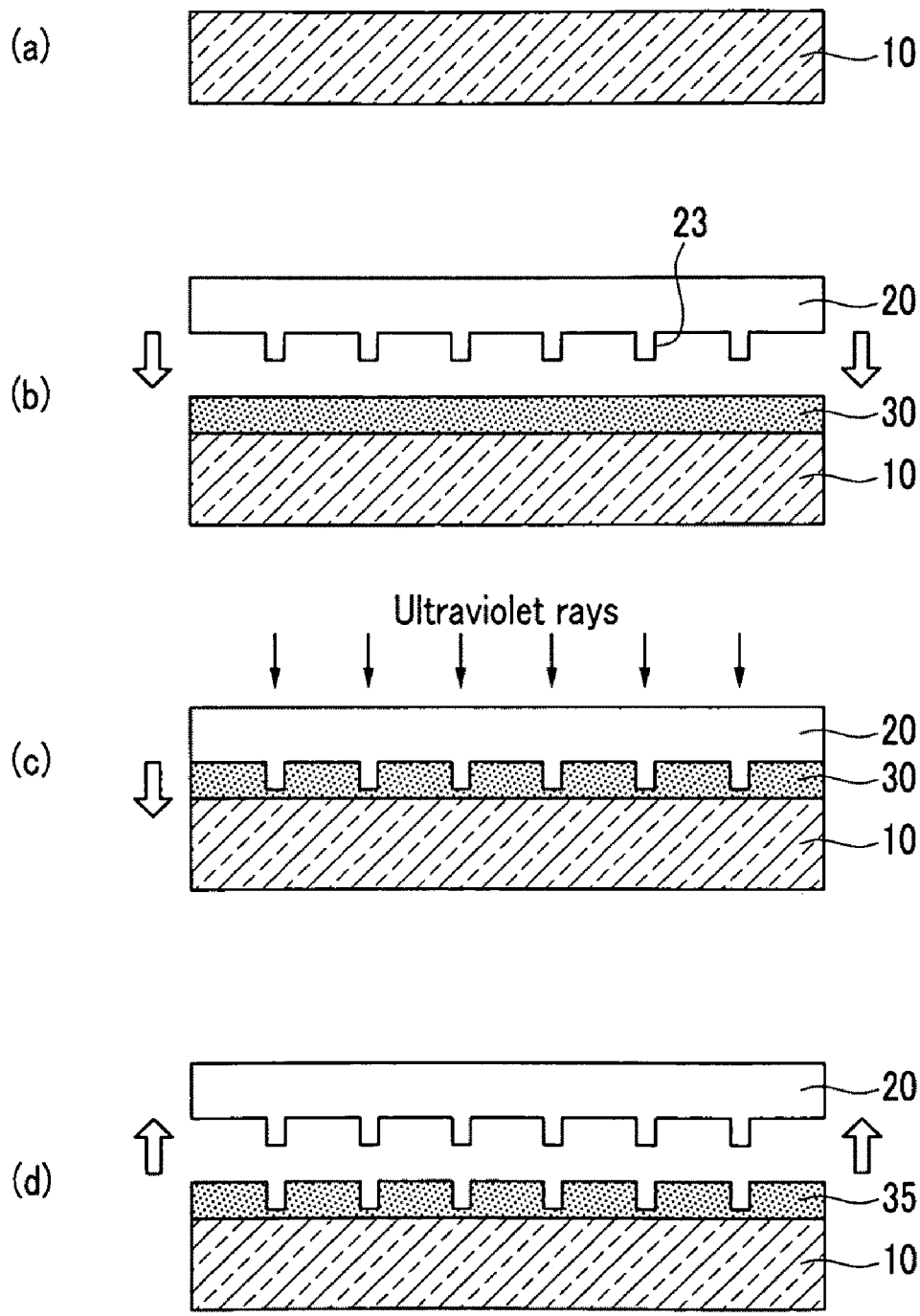
FIG. 2 is a process diagram showing the method for forming the metal oxide thin film pattern using the nanoimprinting according to an embodiment of the present invention.

FIG. 1 is a flowchart showing a method for forming a metal oxide thin film pattern using nanoimprinting according to an embodiment of the present invention, and FIG. 2 is a process diagram thereof.

A method for forming a metal oxide thin film pattern using an imprint will be described with reference to FIGS. 1 and 2.

First, a substrate is prepared and a photosensitive metal-organic material precursor solution is coated on a substrate 10 (S1).

The substrate 10 may be made of inorganic materials such as silicon, gallium arsenic, gallium phosphorous, gallium arsenic phosphorous, silicon oxide, sapphire, quartz, a glass substrate, and a transparent polymer such as polycarbonate, polyethylene naphthalate, polynoromene, polyacrylate, polyvinylalcohol, polyimide, polyethylene terephthalate, and polyethersulphone.

In order to prepare the photosensitive metal-organic material precursor solution, the metal-organic material precursor is first composed by bonding an organic material ligand to a metal element.

The metal element consisting of the metal-organic material precursor may include any one or more metals selected from a group consisting of lithium (Li), beryllium (Be), boron (B), sodium (Na), magnesium (Mg), aluminum (Al), silicon (Si), phosphorous (P), sulfur (S), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), arsenic (As), selenium (Se), rubidium (Rb), strontium (Sr), zirconium (Zr), niobium (Nb), molybdenum (Mo), ruthenium (Ru), rhodium (Rh), indium (In), tin (Sn), antimony (Sb), barium (Ba), lanthanum (La), cerium (Ce), praseodymium (Pr), neodymium (Nd), promethium (Pm), gadolinium (Gd), hafnium (Hf), tantalum (Ta), tungsten (W), iridium (Ir), lead (Pb), bismuth (Bi), polonium (Po), and uranium (U). These metals may commonly form the metal oxide thin film when the metal-organic precursor is exposed to ultraviolet rays.

The metal-organic material precursor includes about 5 to 95 wt % of the organic material ligand and a metal element added to make a total amount reach 100 wt %, and the metal element bonds to the organic material ligand to prepare the metal-organic material precursor. The metal-organic material precursor is dissolved in a solvent to prepare a photosensitive metal-organic precursor solution. At this time, the solvent may be included at about 5 to 95 wt % with respect to a total amount of the photosensitive metal-organic material precursor solution.

The organic material ligand is selected from a group consisting of ethylhexanoate, acetylacetonate, dialkyldithiocarbamate, carboxylic acid, carboxylate, pyridine, diamine, arsine, diarsine, phosphine, diphosphine, butoxide, isopropoxide, ethoxide, chloride, acetate, carbonyl, carbonate, hydroxide, arena, beta-diketonate, 2-nitrobenzaldehyde, and mixtures thereof.

The solvent may be one selected from a group consisting of hexanes, 4-methyl-2-pentanone, ketone, methyl isobutyl ketone, methyl ethyl ketone, water, methanol, ethanol, propanol, isopropanol, butanol, pentanol, hexanol, dimethyl sulfoxide (DMSO), dimethylformamide (DMF), acetone, and tetra hydrofuran (THF).

In the metal-organic material precursor prepared as described above, the organic material can be decomposed by ultraviolet rays.

The photosensitive metal-organic material precursor solution can be coated on the substrate by using any one of spin coating, dip coating, spray coating, and solution dropping methods.

The solution coated by the method forms a photosensitive metal-organic material precursor coating layer 30 on the substrate 10. The photosensitive metal-organic material precursor coating layer 30 may be heated and dried to remove residual solvent.

Next, the photosensitive metal-organic material precursor coating layer 30 is pressurized by a mold 20 that is patterned to have a protrusion and depression structure (S2).

The mold 20 has a pattern 23 of protrusion and depressions that is opposite to a pattern to be formed on the substrate 10. In other words, an embossed part of the mold 20 is patterned as an engraved part on the metal thin film on the substrate and the engraved part of the mold 20 is patterned as an embossed part on the metal thin film on the substrate.

The mold 20 may be made of silicon (Si), quartz, or a polymer. For example, a polydimethylsiloxane (PDMS) mold, a polyurethane acrylate (PUA) mold, a polytetrafluoroethylene (PTFE) mold, an ethylene tetrafluoroethylene (ETFE) mold, or a perfluoroalkyl acrylate (PFA) mold may be used.

When the mold 20 is pressurized on the photosensitive metal-organic material precursor solution layer 30, this may be at a pressure of 0 to 100 bar, or under vacuum.

At this time, at least any one of the mold or the substrate is made of a transparent material, and ultraviolet rays can be irradiated by transmitting them through the transparent mold or the transparent substrate.

Next, a cured metal thin film pattern 35 is formed by irradiating ultraviolet rays on the pressurized photosensitive metal-organic material precursor solution coating layer 30 (S3).

As an exposure apparatus for irradiating ultraviolet rays, a laser exposure apparatus configured of KrF (248 nm), ArF (193 nm), and $F_2$ (157 nm), or a lamp exposure apparatus configured of G-line (436 nm) and I-line (365 nm), can be used.

The ultraviolet ray irradiating period can be in a range of 1 second to 10 hours, can be performed at room temperature.

When ultraviolet rays are irradiated on the photosensitive metal-organic material precursor solution coating layer 30 that is coated on the substrate 10, the organic materials attached to the metal are subjected to a photolysis reaction, and thus only the metals remain and are bonded with oxygen in the air, thereby forming a metal oxide thin film pattern 35.

Figure 3:
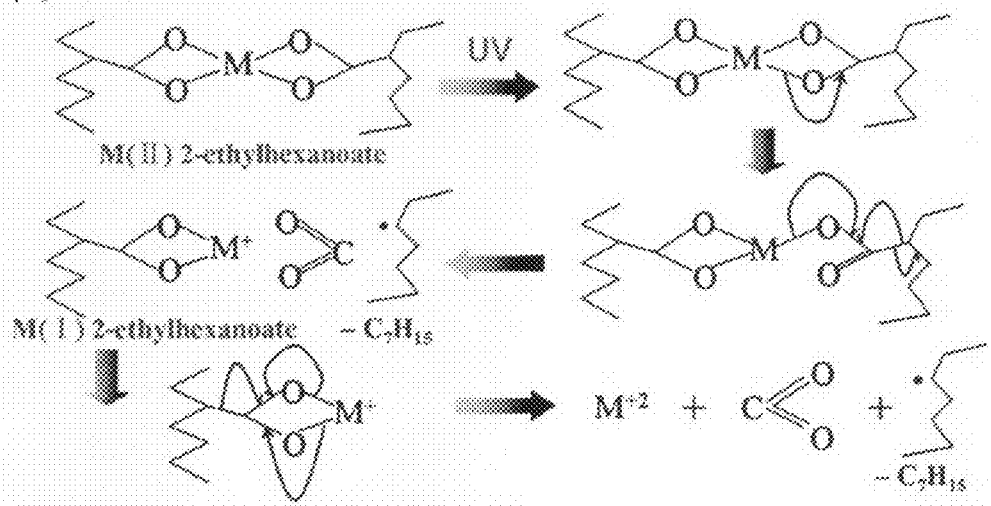
FIG. 3 is a schematic diagram exemplarily showing a mechanism for forming a metal oxide thin film from a metal-organic material precursor upon irradiating ultraviolet rays.
Figure 3:
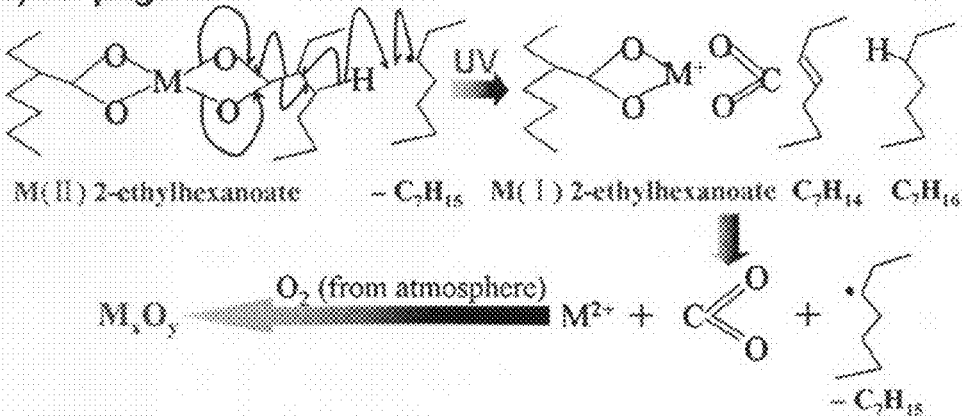

FIG. 3 is a schematic diagram exemplarily showing a mechanism for forming a metal oxide thin film from a metal-organic material precursor upon irradiating ultraviolet rays. The photolysis reaction will be described in more detail with reference to FIG. 3.

In FIG. 3, M is metal elements and may be one or two or more of the listed metal elements. As an example, the metal-organic material precursor including one metal (Ti) may form a $TiO_2$ thin film and the metal-organic material precursor including two or more metals (Pb, Zr, Ti) may form a $Pb(Zr_xTi_{1-x})O_3$ thin film.

FIG. 3 shows the metal-organic material precursor of M(II) 2-ethylhexanoate as an example, and when ultraviolet rays are irradiated, an initiation reaction as shown in FIG. 3(a) is performed and M(II) 2-ethylhexanoate is photolyzed into M(I) 2-ethylhexanoate, $CO_2$, $.C_7H_{15}$. When ultraviolet rays are continuously irradiated, the cleavage of $M^{2+}$, $CO_2$, and the ligand occurs by the continued photochemical reaction, and when the generated $CO_2$ is volatilized, $.C_7H_{15}$ radicals formed by the initiation reaction induce a growth reaction that is a second reaction. In other words, as shown in FIG. 3(b), a bond dissociation reaction such as with M(I) 2-ethylhexanoate, $C_7H_{14}$, and $C_7H_{16}$ is performed by hydrogen abstraction that is an organic light reaction, and only $M^{2+}$ finally remains according to the progress of the reaction and is bonded with oxygen in the air, thereby forming the metal oxide film thin.

Next, the patterned mold 20 is removed from the metal oxide thin film pattern 35 (S4).

When the mold 20 is released and removed from the metal oxide thin film pattern 35, the substrate 10 on which the upper portion of the metal oxide thin film pattern 35 is formed is obtained.

Then, the height of the metal oxide thin film pattern patterned on the substrate and the thickness and refractive index of the remaining layer can be controlled by performing an annealing process in which heat treats the metal oxide thin film (S5). In other words, the patterned height and thickness and the refractive index of the remaining layer can be controlled by controlling the annealing time and temperature. The annealing step can be selectively adopted.

Figure 4:
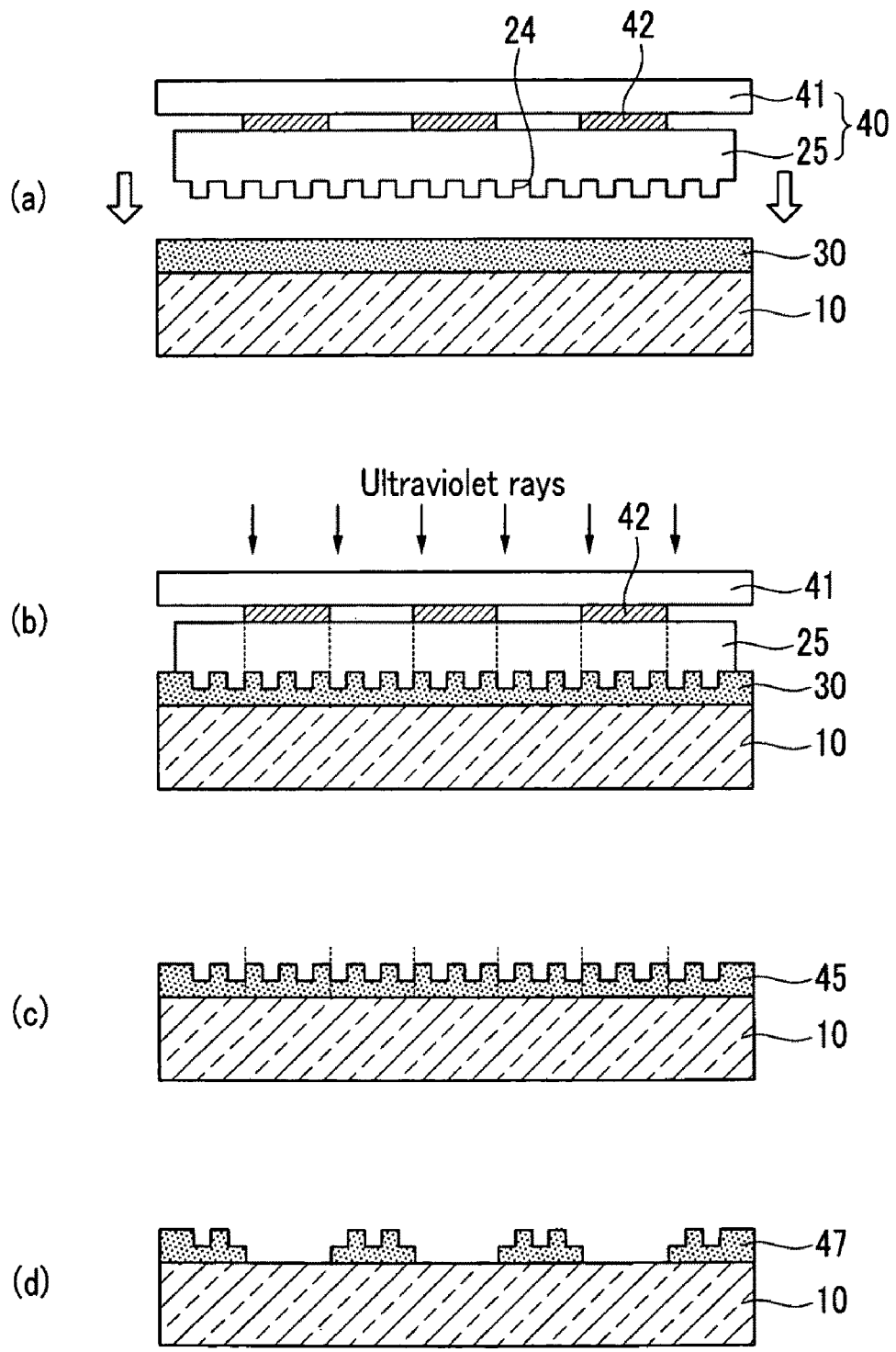
FIG. 4 is a process diagram showing a method for forming a micro-/nano-composite pattern according to another embodiment of the present invention.

FIG. 4 is a process diagram showing a method for forming a micro/nanocomposite pattern according to another embodiment of the present invention.

Referring to FIG. 4, in order to simultaneously form the first pattern and the second pattern through a single process, the mold 25 having the protrusion and depression structure 24 of the first pattern and a mask 41 having a second pattern 42 are prepared.

An integrated mold 40 is manufactured by pressing the mold 25 having the protrusion and depression structure 24 of the first pattern on the lower end of the mask 41.

Next, the coating layer 30 is formed by coating the photosensitive metal-organic material precursor solution on the upper portion of the substrate 10 and pressurizing it by the integrated mold 40. In the pressurized state, ultraviolet rays are irradiated from the upper portion of the integrated mold 40 toward the coating layer 30.

The photosensitive metal-organic material coating layer 30 exposed to ultraviolet rays in the pressurized state of the protrusion and depression structure 24 of the first pattern of the integrated mold 40 is cured to form a metal oxide thin film pattern 45. At this time, the coating layer 30 of the portion where ultraviolet rays are blocked by the second pattern 42 of the mask 41 is not cured.

Ultraviolet rays are irradiated and then the integrated mold 40 is released from the metal oxide thin film pattern 45, and the metal oxide thin film pattern 45 is cleaned (developed) by a solvent and the non-cured portion is removed, thereby forming a composite pattern 47 where the first pattern and the second pattern are simultaneously formed.

At this time, the protrusion and depression structure 24 of the first pattern may be formed at a nanoscale and the second pattern 42 may be formed at a microscale. In this case, the composite pattern of a micro/nanoscale can be formed. In other words, the composite pattern of a micro/nanoscale is formed by the mask 41 having the pattern of a microscale and the mold 25 having the protrusion and depression pattern of a nanoscale.

Further, the mask 41 may be, for example, a mask where a chromium (Cr) pattern of a microscale is formed. The second pattern 42 of a microscale may be formed through a known micro-patterning process.

In addition, the height of the pattern and the thickness and refractive index can be selectively controlled by annealing the thus formed composite pattern 47.

The method for forming a metal oxide thin film as described above can be applied to forming a photonic crystal structure of a light emitting diode (LED) device.

The photonic crystal is a lattice structure in which two or more dielectric materials having difference refractive indexes are infinitively repeated in a periodic structure of a nanoscale. At this time, an inhibition band, in which a wavelength of light cannot propagate a medium, is shown, which is referred to a photonic bandgap. In other words, the photonic crystal forms and controls the photonic bandgap by using the periodic refractive difference to convert the inner reflective path of light, thereby making it possible to maximize the light extracting efficiency of the LED device.

Figure 5:
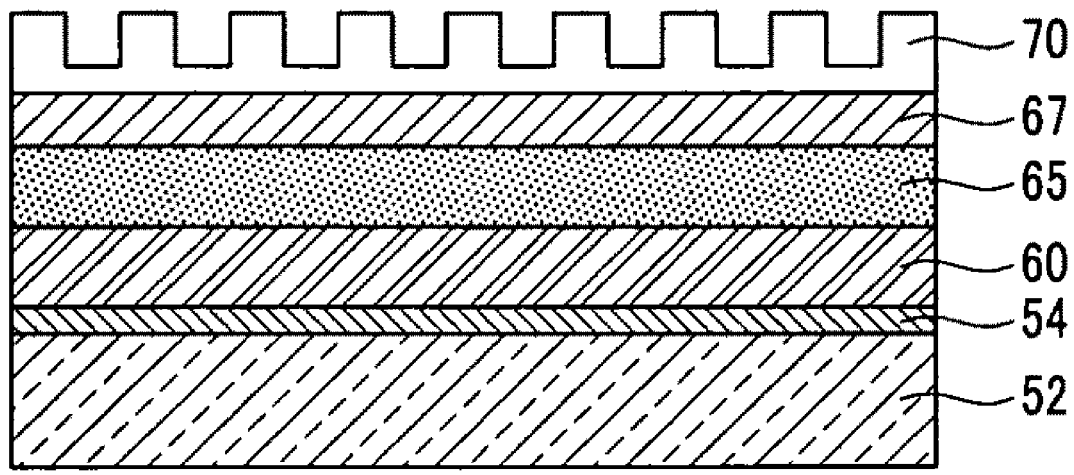
FIG. 5 is a cross-sectional view showing the LED device including a photonic crystal layer manufactured according to the method for forming the metal oxide thin film pattern according to yet another embodiment of the present invention.

FIG. 5 is a cross-sectional view showing the LED device including a photonic crystal layer manufactured according to the method for forming the metal oxide thin film pattern according to yet another embodiment of the present invention.

Referring to FIG. 5, an LED device 50 has a structure in which a GaN buffer layer 54 is formed on a substrate 52, an n-type GaN layer 60, a light emitting layer 65, and a p-type GaN layer 67 are sequentially formed on the GaN buffer layer 54, and a photonic crystal layer 70 is formed on the p-type GaN layer 67.

In order to manufacture the photonic crystal layer 70, the photosensitive metal-organic material precursor solution is first prepared.

Next, the photosensitive metal-organic material precursor solution is coated on the p-type GaN layer 67, and the photosensitive metal-organic material precursor solution coating layer is pressurized by the patterned mold. The patterned mold may be formed to have the protrusion and depression structure that corresponds to the previously designed photonic crystal structure.

The cured metal oxide thin film pattern is formed by irradiating ultraviolet rays on the pressurized photosensitive metal-organic material precursor solution coating layer, and the mold then is removed, thereby forming the photonic crystal layer structure.

As such, since the metal oxide thin film is directly patterned by using the nanoimprint process, it can reduce the difference with the refractive index of the substrate 52 of the LED device 50, remove a complicated process of performing the polymer patterning process and then etching the substrate 52 through the etching process, and removing the organic material, and can prevent the deterioration of the electrical characteristics of the substrate 52 that is caused during the etching process, as compared to the case of forming the polymer organic material pattern using the existing nanoimprint process.

As the materials used to form the photonic crystal layer 70, $TiO_2$ and ZnO having high refractive indexes can be included, and GaN/GaAs/GaP used as the substrate of the LED device 50 can be used.

Hereinafter, examples of the embodiments of the present invention will be described with reference to the accompanying drawings.

Example 1

In order to compose the photosensitive metal-organic material precursor solution of titanium (Ti), 1.0000 g of a Ti(VI)(n-butoxide)$_2$(2-ethylhexanoate)$_2$ composition and 5.000 g of hexanes (Aldrich Co., U.S.A.) are injected and mixed and agitated for 24 hours, thereby preparing a $TiO_2$ sol of 0.27 molarity.

Herein, in order to compose Ti(VI)(n-butoxide)$_2$(2-ethylhexanoate)$_2$, 10.5266 g of Ti(VI)(n-butoxide)$_4$ (Aldrich Co., U.S.A.), 8.7400 g of 2-ethylhexanoic acid (Aldrich Co., U.S.A.), and 15.000 g of hexanes are put in a round flask and evaporated and condensed by a rotary evaporator for 72 hours, thereby composing the Ti(VI)(n-butoxide)$_2$(2-ethylhexanoate)$_2$.

The photosensitive metal-organic material precursor solution of the composed titanium is spin-coated on one side of the upper end of the silicon substrate under a condition of 3000 rpm, and then the mold, in which a pattern in a pillar or line shape is formed, is pressed.

Figure 6:
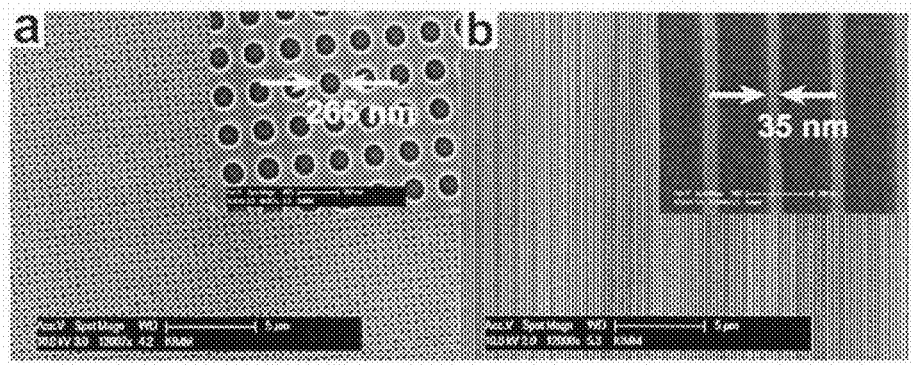
FIG. 6 is an SEM image of a direct pattern type titanium oxide ($TiO_2$) thin film formed according to example 1 of the present invention.

Ultraviolet rays are irradiated for 20 minutes, and the mold is then released to form the titanium oxide thin film pattern, as shown in FIG. 6. FIG. 6(a) shows a pattern in a hole shape, and FIG. 6(b) shows a pattern in a line shape.

As shown in FIG. 6, it is confirmed that the $TiO_2$ thin film patterned is formed by the nanoimprint process using the photosensitive metal-organic material precursor solution of titanium.

Example 2

In order to compose the photosensitive metal-organic material precursor solution of tin (Sn), 1.0000 g of Sn(II)-ethylhexanoate (Alfa Aesar Co., U.S.A.) and 6.000 g of hexanes (Aldrich Co., U.S.A.) are injected and mixed and agitated for 24 hours, thereby preparing a $SnO_2$ sol of 0.21 molarity.

The photosensitive metal-organic material precursor solution of the composed tin (Sn) is spin-coated on one side of the upper end of the silicon substrate under a condition of 3000 rpm, and then the mold, in which the pattern in a pillar shape is formed, is pressed.

Figure 7:
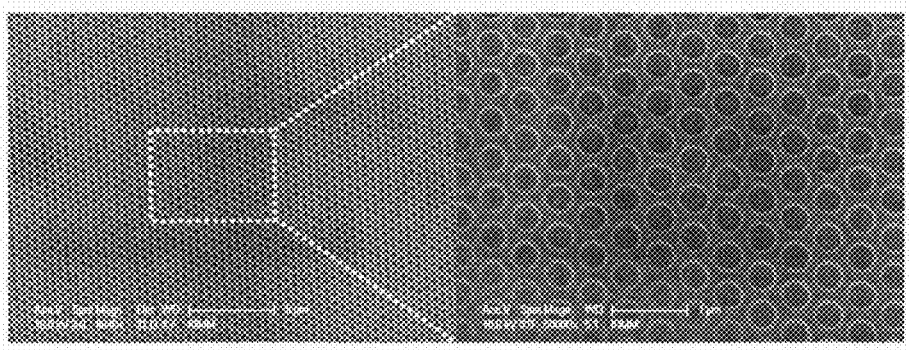
FIG. 7 is an SEM image of a direct pattern type tin oxide ($SnO_2$) thin film formed according to example 2 of the present invention.

Ultraviolet rays are irradiated for 30 minutes, and the mold is then released to form the tin oxide thin film pattern, as shown in FIG. 7.

As shown in FIG. 7, it is confirmed that the $SnO_2$ thin film patterned by the nanoimprint process is formed by the nanoimprint process using the photosensitive metal-organic material precursor solution of tin (Sn).

Example 3

In order to compose the photosensitive metal-organic material precursor solution of various tins (Sn), 1.0000 g of Sn(II)2-ethylhexanoate (Alfa Aesar Co., U.S.A.) and 6.000 g of MIBK(4-methyl-2-pentanone) (Aldrich Co., U.S.A.) are injected and mixed and agitated for 24 hours, thereby preparing a $SnO_2$(II) sol of 0.25 molarity.

The photosensitive metal-organic material precursor solution (II) of the composed tin (Sn) is spin-coated on one side of the upper end of the silicon substrate under a condition of 3000 rpm, and then the mold, in which the pattern in a pillar shape is formed, is pressed.

Figure 8:
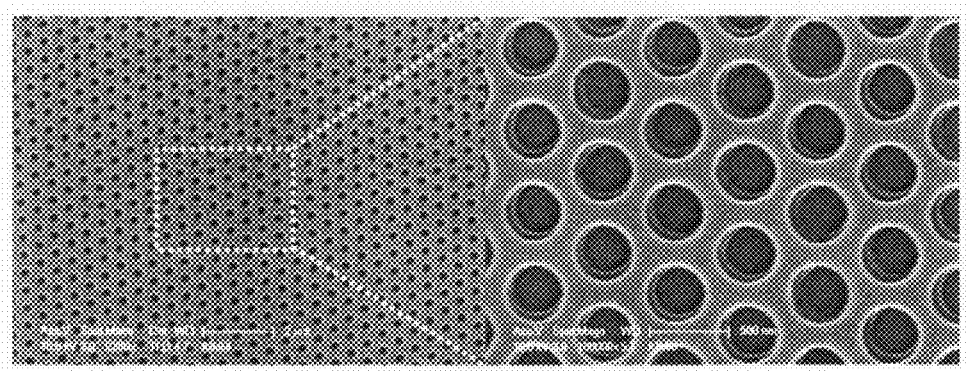
FIG. 8 is another SEM image direct pattern type tin oxide ($SnO_2$) thin film formed according to example 3 of the present invention.

Ultraviolet rays are irradiated for 30 minutes, and the mold is then released to form the tin oxide thin film pattern, as shown in FIG. 8.

As shown in FIG. 8, it is confirmed that the $SnO_2$ thin film patterned is formed by the nanoimprint process using the photosensitive metal-organic material precursor solution (II) of tin (Sn). In particular, in the case of the present example, in order to compose the metal-organic material precursor solution of tin (Sn), it is confirmed that the photosensitive metal-organic material precursor solution of various tins (Sn) is composed by being melted in various solvents.

Example 4

In order to compose the photosensitive metal-organic material precursor solution of zirconium, 1.6893 g of Zr(VI)-2-ethylhexanoate (Strem Co., U.S.A.) and 10.6749 g of hexanes (Aldrich Co., U.S.A.) are injected and mixed and agitated for 24 hours, thereby preparing a $ZrO_2$ sol of 0.063 molarity.

The photosensitive metal-organic material precursor solution of the composed zirconium is spin-coated on one side of the upper end of the silicon substrate under a condition of 3000 rpm, and then the mold, in which the pattern in a hole shape is formed, is pressed.

Figure 9:
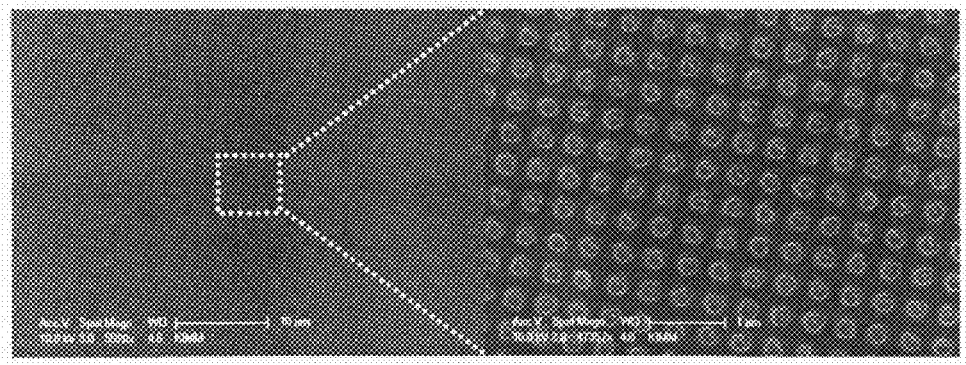
FIG. 9 is an SEM image of a direct pattern type zirconium oxide ($ZrO_2$) thin film formed according to example 4 of the present invention.

Ultraviolet rays are irradiated for 30 minutes, and the mold is released to form the zirconium oxide thin film pattern, as shown in FIG. 9.

As shown in FIG. 9, it is confirmed that the $ZrO_2$ thin film patterned is formed by the nanoimprint process using the photosensitive metal-organic material precursor solution of zirconium.

Example 5

In order to form the composite patterned $TiO_2$ thin film of a micro/nanoscale, the photosensitive metal-organic material precursor solution of titanium composed in Example 1 was spin-coated on the upper portion of the silicon substrate under a condition of 3000 rpm, and then the integrated mold is manufactured by bonding the micro-patterned chromium (Cr) mask and the nano-patterned PUA mold and pressurizing it at a normal pressure.

Figure 10:
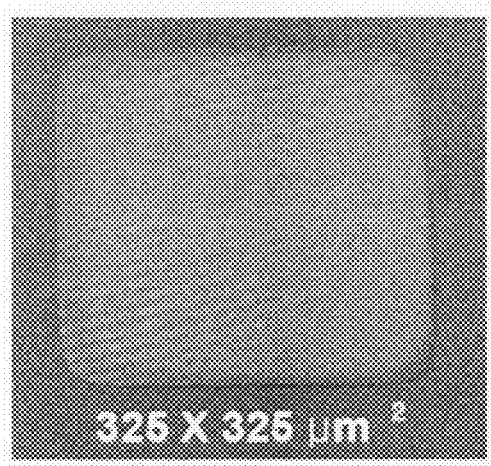
FIG. 10 is an SEM image (a, b, c) of a complex patterned titanium oxide ($TiO_2$) thin film of a micro/nanoscale formed according to example 5 of the present invention.
Figure 10:
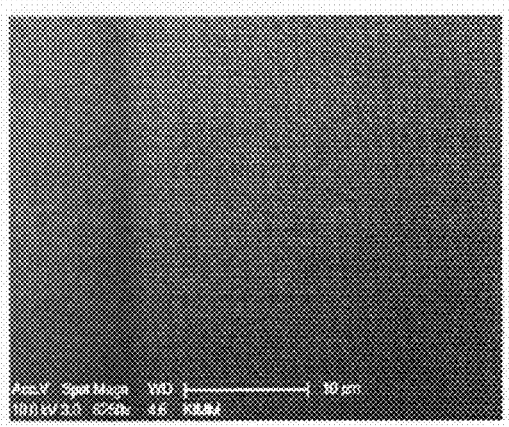
Figure 10:
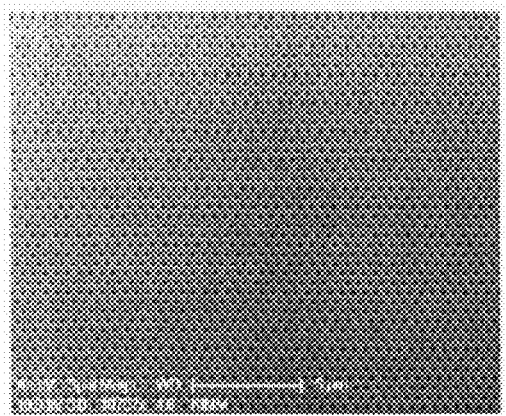
Figure 11:
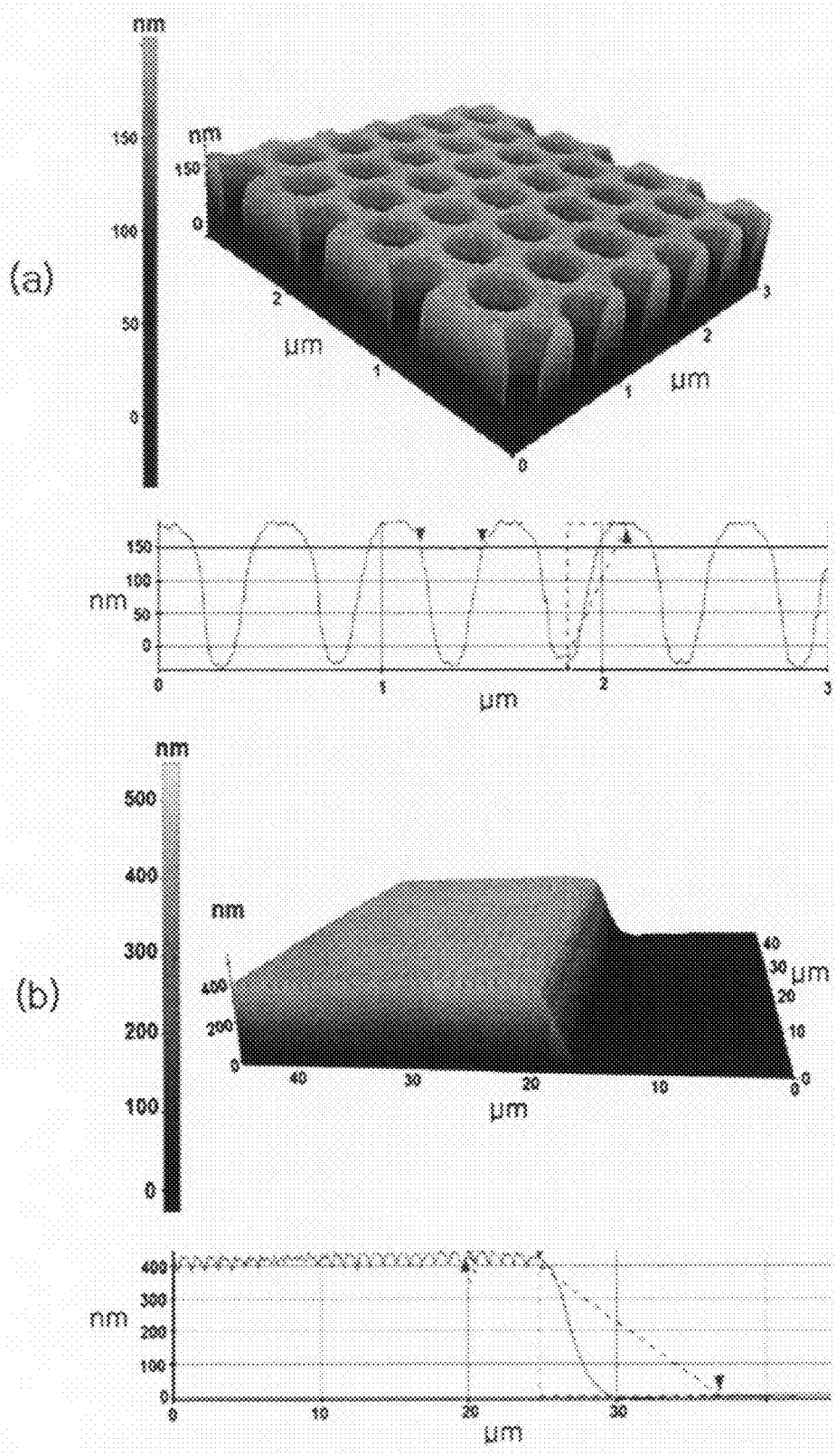
FIG. 11 is an AFM image (a, b) of a complex patterned titanium oxide ($TiO_2$) thin film of a micro/nanoscale formed according to example 5 of the present invention.

Ultraviolet rays are irradiated for 20 minutes, and the integrated mold of the chromium mask and the PUA mold is released and cleaned by being dipped in the solution to form the composite patterned $TiO_2$ thin film of a microscale/nanoscale, as shown in FIGS. 10 and 11.

As shown in FIGS. 10 and 11, it is confirmed that the composite patterned $TiO_2$ thin film of a microscale/nanoscale can be formed by the nanoimprint process using the integrated mold of the chromium mask and the PUA mold.

FIGS. 10(a) to 10(c) shown that a uniform pattern is formed over a large area, and edges of the pattern have a clear boundary. FIGS. 11(a) and 11(b) show that a hexagonal hole with a diameter of 265 nm and a depth of 180 nm is formed, and a steeply formed edge can be obtained.

Example 6

In order to apply the directly patterned $TiO_2$ thin film to the photonic crystal structure of the LED device, the photosensitive metal-organic material precursor solution of titanium composed in the example 1 is coated on one side of the upper end of a p-type GaN/MQW layer/n-type GaN/GaN buffer layer/sapphire substrate under a condition of 3000 rpm, and the mold, in which the pattern in a pillar shape is formed, is pressed.

Ultraviolet rays are irradiated for 20 minutes, and the mold is then released to form the titanium oxide thin film pattern having the photonic crystal structure.

As the photonic crystal structure, the following four types of samples were manufactured in order to confirm the pattern and the annealing effect of the $TiO_2$ thin film.

Example 6-1 patterned $TiO_2$ thin film

Example 6-2

$TiO_2$ thin film formed by annealing the patterned thin film for 1 hour at 400° C.

Comparative Example 1 non-patterned $TiO_2$ thin film

Comparative Example 2

$TiO_2$ thin film formed by annealing the non-patterned thin film for 1 hour at 400° C.

Figure 12:
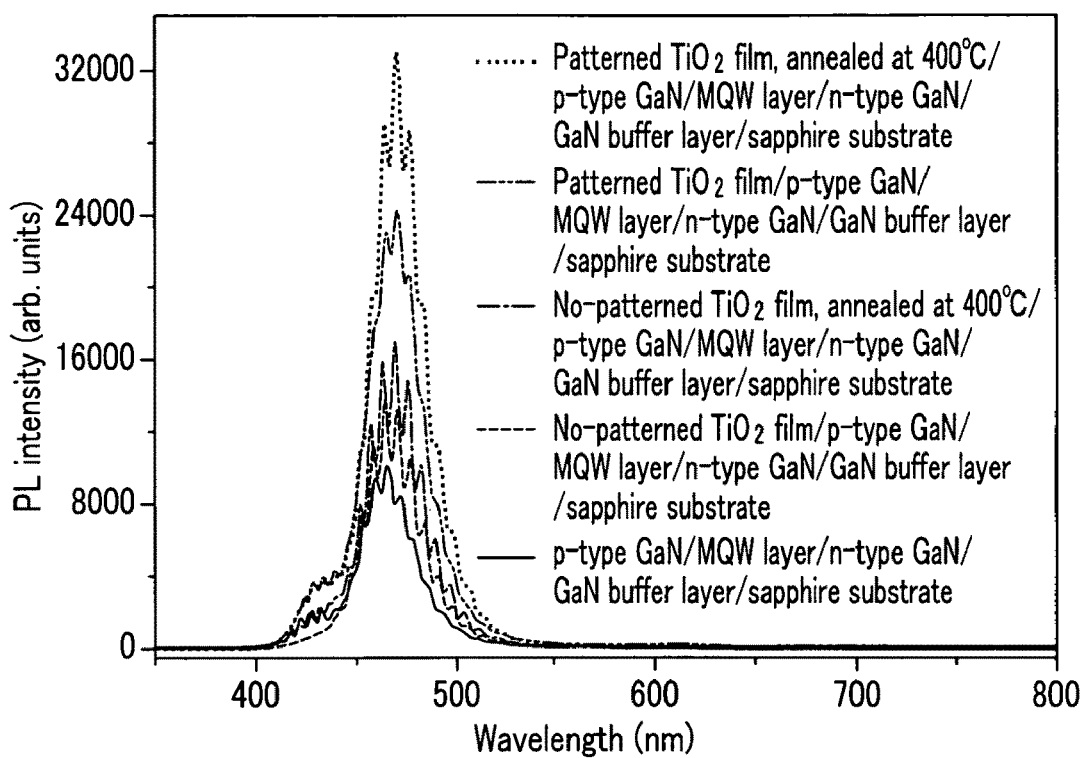
FIG. 12 is a graph showing improved light emitting characteristics of a photonic crystal layer titanium oxide ($TiO_2$) thin film of an LED device formed according to example 6 of the present invention.

In order to confirm the light extraction efficiency of the respective manufactured LED devices, they were analyzed using PL (photoluminescence, He—Cd Laser) (OmniChrome Co., U.S.A.) and the results are shown in FIG. 12.

As shown in FIG. 12, when the PL intensity of the p-type GaN/MQW layer/n-type GaN/GaN buffer layer/sapphire substrate was considered to be 100%, in the case of the non-patterned $TiO_2$ thin film (Comparative Example 1), it is improved by 33%, in the case of the $TiO_2$ thin film (Comparative Example 2) formed by annealing the non-patterned thin film for 1 hour at 400° C., it is improved by 67%, in the case of the patterned $TiO_2$ thin film (Example 6-1), it is improved by 139%, and in the case of the $TiO_2$ thin film (Example 6-2) formed by annealing the patterned thin film for 1 hour at 400° C., it is improved by 225%. In other words, as the photonic crystal layer, it is confirmed that the improvement of the light extraction efficiency is maximized by patterning and annealing the $TiO_2$ thin film.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for forming a metal oxide thin film pattern using nanoimprinting, comprising:
   coating a photosensitive metal-organic material precursor solution on a substrate;
   pressurizing the photosensitive metal-organic material precursor coating layer to a mold patterned to have a protrusion and depression structure pattern;
   forming the metal oxide thin film pattern by irradiating ultraviolet rays to the pressurized photosensitive metal-organic material precursor coating layer to cure it; and
   removing the patterned mold from the metal oxide thin film pattern.

2. The method for forming a metal oxide thin film pattern using nanoimprinting of claim 1, further comprising
   annealing the metal oxide thin film pattern.

3. The method for forming a metal oxide thin film pattern using nanoimprinting of claim 1, wherein
   the photosensitive metal-organic material precursor solution includes the metal-organic material precursor composed by bonding an organic material ligand to the metal.

4. The method for forming a metal oxide thin film pattern using nanoimprinting of claim 3, wherein
   a metal element forming the metal-organic material precursor includes any one or more metals selected from a group consisting of lithium (Li), beryllium (Be), boron (B), sodium (Na), magnesium (Mg), aluminum (Al), silicon (Si), phosphorous (P), sulfur (S), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), arsenic (As), selenium (Se), rubidium (Rb), strontium (Sr), zirconium (Zr), niobium (Nb), molybdenum (Mo), ruthenium (Ru), rhodium (Rh), indium (In), tin (Sn), antimony (Sb), barium (Ba), lanthanum (La), cerium (Ce), praseodymium (Pr), neodymium (Nd), promethium (Pm), gadolinium (Gd), hafnium (Hf), tantalum (Ta), tungsten (W), iridium (Ir), lead (Pb), bismuth (Bi), polonium (Po), and uranium (U).

5. The method for forming a metal oxide thin film pattern using nanoimprinting of claim 3, wherein
   the organic material ligand is selected from a group consisting of ethylhexanoate, acetylacetonate, dialkyldithiocarbamate, carboxylic acid, carboxylate, pyridine, diamine, arsine, diarsine, phosphine, diphosphine, butoxide, isopropoxide, ethoxide, chloride, acetate, carbonyl, carbonate, hydroxide, arena, beta-diketonate, and 2-nitrobenzaldehyde, and mixtures thereof.

6. The method for forming a metal oxide thin film pattern using nanoimprinting of claim 3, wherein
   the metal-organic material precursor is dissolved in a solvent selected from a group consisting of hexanes, 4-methyl-2-pentanone, ketone, methyl isobutyl ketone, methyl ethyl ketone, water, methanol, ethanol, propanol, isopropanol, butanol, pentanol, hexanol, dimethyl sulfoxide (DMSO), dimethylformamide (DMF), N-methylpyrrolidone, acetone, acetonitrile, tetrahydrofuran (THF), tecan, nonane, octane, heptane, and pentane.

7. A method for forming a metal oxide thin film pattern using nanoimprinting, comprising:
   attaching a mask having a second pattern on a mold having a protrusion and depression structure of a first pattern;
   coating a photosensitive metal-organic material precursor solution on a substrate;
   pressurizing the photosensitive metal-organic material precursor coating layer to the mold to which the mask is attached;
   forming the metal oxide thin film pattern by irradiating ultraviolet rays to the pressurized photosensitive metal-organic material precursor coating layer to cure it;
   removing the patterned mold from the metal oxide thin film pattern; and
   developing the metal oxide thin film pattern.

8. The method for forming a metal oxide thin film pattern using nanoimprinting of claim 7, wherein
   the first pattern is formed to have a protrusion and depression structure of a nanoscale, and the second pattern is formed to have a plane structure of a microscale.

9. The method for forming a metal oxide thin film pattern using nanoimprinting of claim 7, further comprising
   annealing the metal oxide thin film pattern.

10. The method for forming a metal oxide thin film pattern using nanoimprinting of claim 7, wherein
    the photosensitive metal-organic material precursor solution includes the metal-organic material precursor composed by bonding an organic material ligand to the metal.

11. The method for forming a metal oxide thin film pattern using nanoimprinting of claim 10, wherein
    a metal element forming the metal-organic material precursor includes any one or more metals selected from a group consisting of lithium (Li), beryllium (Be), boron (B), sodium (Na), magnesium (Mg), aluminum (Al), silicon (Si), phosphorous (P), sulfur (S), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), arsenic (As), selenium (Se), rubidium (Rb), strontium (Sr), zirconium (Zr), niobium (Nb), molybdenum (Mo), ruthenium (Ru), rhodium (Rh), indium (In), tin (Sn), antimony (Sb), barium (Ba), lanthanum (La), cerium (Ce), praseodymium (Pr), neodymium (Nd), promethium (Pm), gadolinium (Gd), hafnium (Hf), tantalum (Ta), tungsten (W), iridium (Ir), lead (Pb), bismuth (Bi), polonium (Po), and uranium (U).

12. The method for forming a metal oxide thin film pattern using nanoimprinting of claim 10, wherein
    the organic material ligand is selected from a group consisting of ethylhexanoate, acetylacetonate, dialkyldithiocarbamates, carboxylic acid, carboxylate, pyridine, diamine, arsine, diarsine, phosphine, diphosphine, butoxide, isopropoxide, ethoxide, chloride, acetate, carbonyl, carbonate, hydroxide, arena, beta-diketonate, and 2-nitrobenzaldehyde, and mixtures thereof.

13. The method for forming a metal oxide thin film pattern using nanoimprinting of claim 10, wherein
    the metal-organic material precursor is dissolved in a solvent selected from a group consisting of hexanes, 4-methyl-2-pentanone, ketone, methyl isobutyl ketone, methyl ethyl ketone, water, methanol, ethanol, propanol, isopropanol, butanol, pentanol, hexanol, dimethyl sulfoxide (DMSO), dimethylformamide (DMF), N-methylpyrrolidone, acetone, acetonitrile, tetrahydrofuran (THF), tecan, nonane, octane, heptane, and pentane.

14. A method for manufacturing an LED device having a photonic crystal structure, comprising:

coating a photosensitive metal-organic material precursor solution on a layer, on which the photonic crystal structure is formed, on a substrate;

pressurizing the photosensitive metal-organic material precursor coating layer to a mold patterned to have a protrusion and depression structure corresponding to the photonic crystal structure;

forming a metal oxide thin film pattern by irradiating ultraviolet rays to the pressurized photosensitive metal-organic material precursor coating layer to cure it; and removing the mold from the metal oxide thin film pattern having the photonic crystal structure.

15. The method for manufacturing an LED device using nanoimprinting of claim 14, further comprising annealing the metal oxide thin film pattern having the photonic crystal structure.

16. The method for manufacturing an LED device using nanoimprinting of claim 14, wherein the photosensitive metal-organic material precursor solution includes the metal-organic material precursor composed by bonding an organic material ligand to the metal.

17. The method for manufacturing an LED device using nanoimprinting of claim 16, wherein a metal element forming the metal-organic material precursor includes any one or more metals selected from a group consisting of lithium (Li), beryllium (Be), boron (B), sodium (Na), magnesium (Mg), aluminum (Al), silicon (Si), phosphorous (P), sulfur (S), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), arsenic (As), selenium (Se), rubidium (Rb), strontium (Sr), zirconium (Zr), niobium (Nb), molybdenum (Mo), ruthenium (Ru), rhodium (Rh), indium (In), tin (Sn), antimony (Sb), barium (Ba), lanthanum (La), cerium (Ce), praseodymium (Pr), neodymium (Nd), promethium (Pm), gadolinium (Gd), hafnium (Hf), tantalum (Ta), tungsten (W), iridium (Ir), lead (Pb), bismuth (Bi), polonium (Po), and uranium (U).

18. The method for manufacturing an LED device using nanoimprinting of claim 16, wherein the organic material ligand is selected from a group consisting of ethylhexanoate, acetylacetonate, dialkyldithiocarbamate, carboxylic acid, carboxylate, pyridine, diamine, arsine, diarsine, phosphine, diphosphine, butoxide, isopropoxide, ethoxide, chloride, acetate, carbonyl, carbonate, hydroxide, arena, beta-diketonate, and 2-nitrobenzaldehyde, and mixtures thereof.

19. The method for manufacturing an LED device using nanoimprinting of claim 16, wherein the metal-organic material precursor is dissolved in a solvent selected from a group consisting of hexanes, 4-methyl-2-pentanone, ketone, methyl isobutyl ketone, methyl ethyl ketone, water, methanol, ethanol, propanol, isopropanol, butanol, pentanol, hexanol, dimethyl sulfoxide (DMSO), dimethylformamide (DMF), N-methylpyrrolidone, acetone, acetonitrile, tetrahydrofuran (THF), tecan, nonane, octane, heptane, and pentane.

* * * * *